US012666723B2

(12) United States Patent (10) Patent No.: US 12,666,723 B2
Ma et al. (45) Date of Patent: Jun. 23, 2026

(54) THREE-DIMENSIONAL INTEGRATED CIRCUIT HAVING ESD PROTECTION CIRCUIT

(71) Applicant: TAIWAN SEMICONDUCTOR MANUFACTURING COMPANY, LTD., Hsinchu (TW)

(72) Inventors: Wei Yu Ma, Taitung City (TW); Chia-Hui Chen, Hsinchu City (TW); Kuo-Ji Chen, Taipei County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 339 days.

(21) Appl. No.: 17/195,563

(22) Filed: Mar. 8, 2021

(65) Prior Publication Data

US 2021/0193647 A1     Jun. 24, 2021

Related U.S. Application Data

(62) Division of application No. 16/050,694, filed on Jul. 31, 2018, now Pat. No. 10,943,897, which is a division of application No. 14/168,151, filed on Jan. 30, 2014, now Pat. No. 11,211,376.

(51) Int. Cl.
| | |
|---|---|
| *H10W 42/60* | (2026.01) |
| *H10D 88/00* | (2025.01) |
| *H10D 89/60* | (2025.01) |
| *H10D 8/00* | (2025.01) |
| *H10W 20/20* | (2026.01) |

(52) U.S. Cl.
CPC ........... *H10D 89/611* (2025.01); *H10D 88/00* (2025.01); *H10D 89/931* (2025.01); *H10W 42/60* (2026.01); *H10D 8/411* (2025.01); *H10W 20/20* (2026.01)

(58) Field of Classification Search
CPC .............................. H01L 23/60; H10W 42/60
USPC .......................................................... 257/491
See application file for complete search history.

(56) References Cited

U.S. PATENT DOCUMENTS

| | | | |
|---|---|---|---|
| 2003/0197242 A1* | 10/2003 | Chen ................... | H01L 27/0251 257/E21.642 |
| 2005/0201031 A1 | 9/2005 | Furuta | |
| 2010/0039740 A1 | 2/2010 | Jalilizeinali et al. | |

(Continued)

*Primary Examiner* — Hsin Yi Hsieh
(74) *Attorney, Agent, or Firm* — Hauptman Ham, LLP

(57) ABSTRACT

An integrated circuit including: two or more substrates stacked one over another and including first and second substrates having a P-type doping, and third and fourth substrates having an N-type doping; the first substrate including a first dielectric isolation structure electrically separating the first substrate into first and second portions; the second substrate including a second dielectric isolation structure electrically separating the second substrate into first and second portions a set of electrical components on one or more of the two or more substrates, and configured to form a circuit, the circuit comprising an internal ground node; a ground reference rail electrically connected to the first substrate and the second substrate and free from being electrically connected to the third substrate and the fourth substrate; and an electrostatic discharge (ESD) protection circuit electrically coupled between the internal ground node and the ground reference rail.

20 Claims, 4 Drawing Sheets

(56)                 References Cited

U.S. PATENT DOCUMENTS

| | | | |
|---|---|---|---|
| 2012/0068360 A1* | 3/2012 | Best | G06F 13/4068 |
| | | | 257/774 |
| 2014/0126089 A1* | 5/2014 | Chang | H10D 84/00 |
| | | | 361/56 |
| 2015/0171031 A1* | 6/2015 | Ker | H01L 24/17 |
| | | | 257/737 |

* cited by examiner

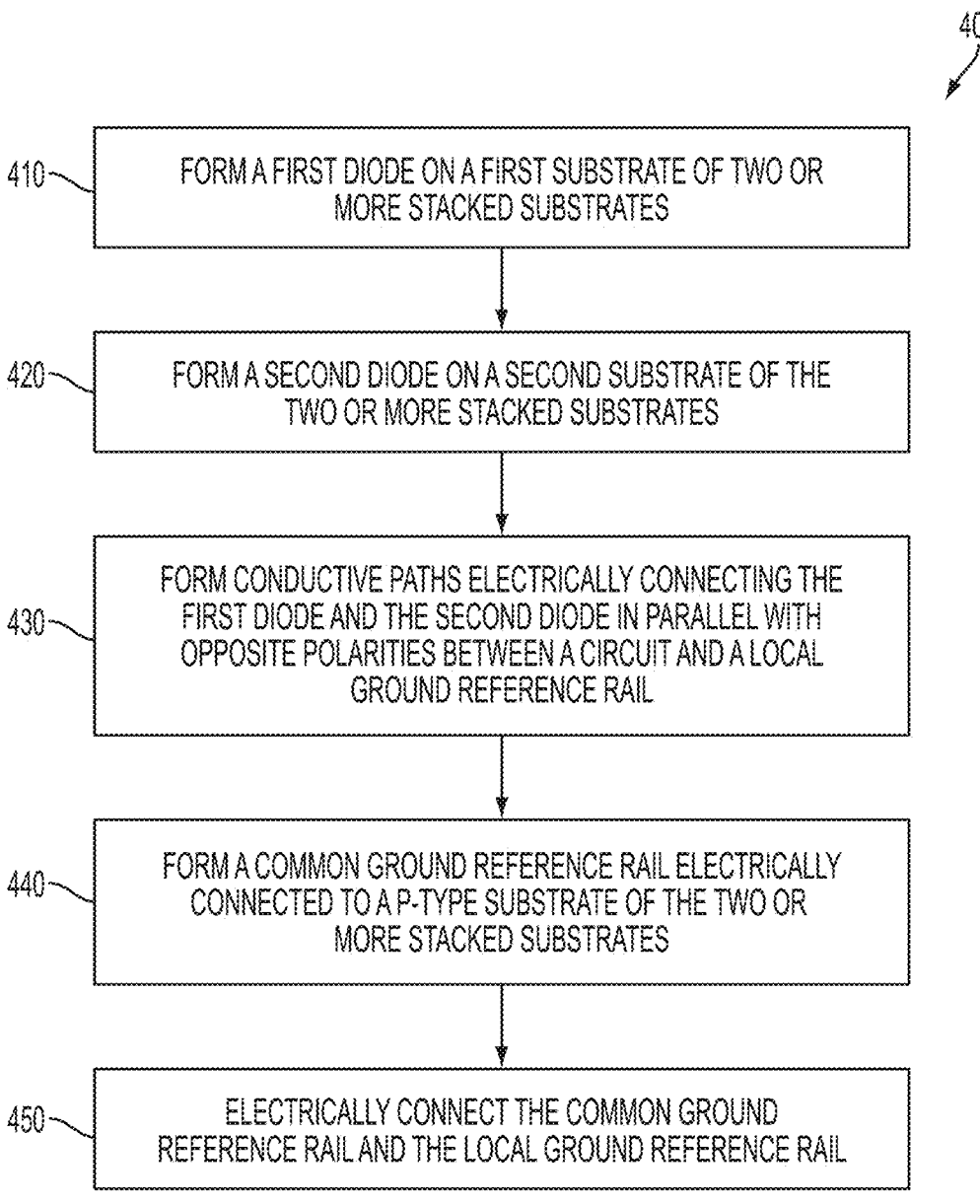

400

410 — FORM A FIRST DIODE ON A FIRST SUBSTRATE OF TWO OR MORE STACKED SUBSTRATES

420 — FORM A SECOND DIODE ON A SECOND SUBSTRATE OF THE TWO OR MORE STACKED SUBSTRATES

430 — FORM CONDUCTIVE PATHS ELECTRICALLY CONNECTING THE FIRST DIODE AND THE SECOND DIODE IN PARALLEL WITH OPPOSITE POLARITIES BETWEEN A CIRCUIT AND A LOCAL GROUND REFERENCE RAIL

440 — FORM A COMMON GROUND REFERENCE RAIL ELECTRICALLY CONNECTED TO A P-TYPE SUBSTRATE OF THE TWO OR MORE STACKED SUBSTRATES

450 — ELECTRICALLY CONNECT THE COMMON GROUND REFERENCE RAIL AND THE LOCAL GROUND REFERENCE RAIL

FIG. 4

THREE-DIMENSIONAL INTEGRATED CIRCUIT HAVING ESD PROTECTION CIRCUIT

PRIORITY CLAIM

The present application is a divisional of U.S. application Ser. No. 16/050,694, filed Jul. 31, 2018, now U.S. Pat. No. 10,943,897, issued Mar. 9, 2021, which is a divisional of U.S. application Ser. No. 14/168,151, filed Jan. 30, 2014, now U.S. Pat. No. 11,211,376, issued Dec. 28, 2021, which are incorporated herein by reference in their entireties.

BACKGROUND

Device manufacturers are continually challenged to deliver value and convenience to consumers by, for example, providing integrated circuits that perform at optimal levels while occupying minimal space. Three-dimensional integrated circuits (3D ICs), such as through-substrate-via (TSV) based 3D ICs or inter-layer-via (ILV) based 3D ICs, increase processing capabilities while reducing an overall footprint of the integrated circuit compared to a two-dimensional integrated circuit having similar processing capabilities. In some applications, various electrostatic discharge (ESD) protection circuits are implemented in a 3D IC to protect the electrical components and circuits on the 3D IC from ESD damage.

DESCRIPTION OF THE DRAWINGS

One or more embodiments are illustrated by way of example, and not by limitation, in the figures of the accompanying drawings, wherein elements having the same reference numeral designations represent like elements throughout.

FIG. 4 is a flow chart of a method of manufacturing an integrated circuit in accordance with one or more embodiments.

DETAILED DESCRIPTION

Figure 1:
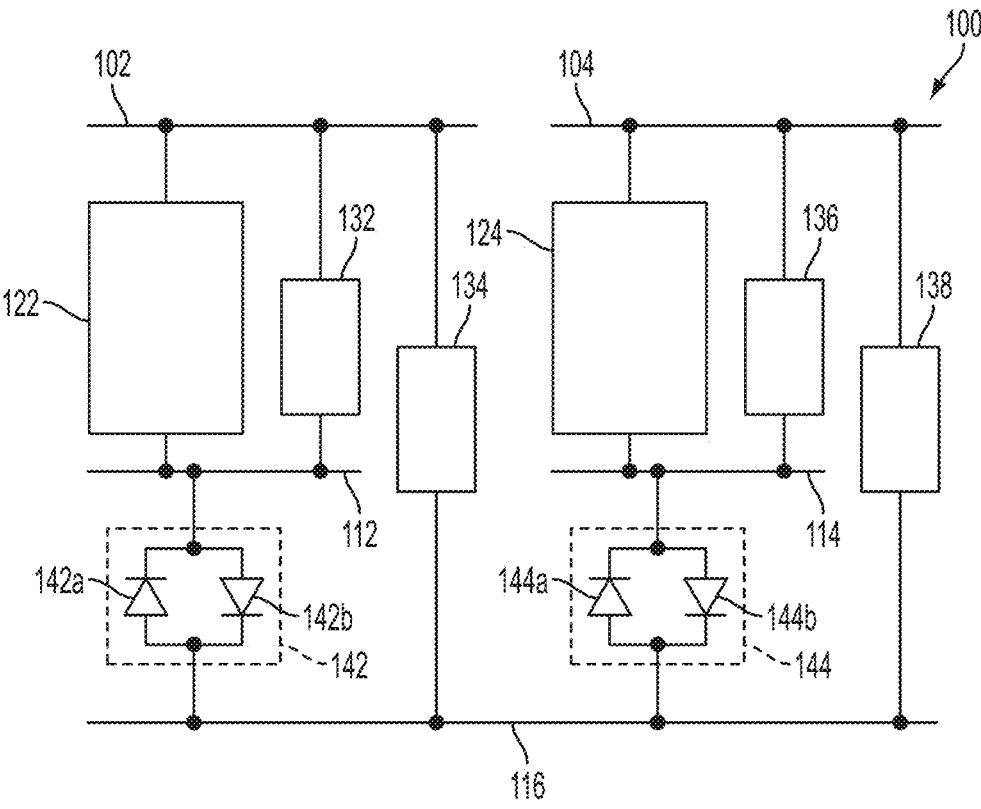
FIG. 1 is a block diagram of a portion of an integrated circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one feature relationship to another feature. The spatially relative terms are intended to cover different orientations of the device including the features.

FIG. 1 is a block diagram of a portion of an integrated circuit 100 in accordance with one or more embodiments. Integrated circuit 100 includes a first supply power rail 102, a second supply power rail 104, a first ground reference rail 112, a second ground reference rail 114, and a common ground reference rail 116. Integrated circuit 100 further includes a first circuit 122 electrically coupled between the first supply power rail 102 and the first ground reference rail 112 and a second circuit 124 electrically coupled between the second supply power rail 104 and the second ground reference rail 114.

In some embodiments, first supply power rail 102 and second supply power rail 104 are coupled to the same or two different power sources. In some embodiments, common ground reference rail 116 is coupled to a reference power source having a voltage level lower than those of supply power rails 102 and 104 or ground. In some embodiments, first supply power rail 102 and first ground reference rail 112 define a first power domain for operating first circuit 122, and second supply power rail 104 and second ground reference rail 114 define a second power domain for operating second circuit 124.

Furthermore, to protect first circuit 122 and second circuit 124 from ESD damage, integrated circuit 100 further includes various ESD protection circuits, such as ESD clamp circuits 132, 134, 136, and 138 and ESD conduction circuits 142 and 144. In some embodiments, one or more of ESD clamp circuits 132, 134, 136, and 138 and ESD conduction circuits 142 and 144 are omitted. In some embodiments, additional ESD protection circuits are implemented to protect first circuit 122 and second circuit 124.

ESD clamp circuit 132 is electrically coupled between first supply power rail 102 and first ground reference rail 112 and configured to provide a conductive path between first supply power rail 102 and first ground reference rail 112 when an ESD event occurs on first supply power rail 102. ESD clamp circuit 134 is electrically coupled between first supply power rail 102 and common ground reference rail 116 and configured to provide a conductive path between first supply power rail 102 and common ground reference rail 116 when an ESD event occurs on first supply power rail 102. ESD clamp circuit 136 is electrically coupled between second supply power rail 104 and second ground reference rail 114 and configured to provide a conductive path between second supply power rail 104 and second ground reference rail 114 when an ESD event occurs on second supply power rail 104. ESD clamp circuit 138 is electrically coupled between second supply power rail 104 and common ground reference rail 116 and configured to provide a conductive path between second supply power rail 104 and common ground reference rail 116 when an ESD event occurs on second supply power rail 104.

ESD conduction circuit 142 is coupled between first ground reference rail 112 and common ground reference rail 116. ESD conduction circuit 142 includes two diodes 142a and 142b, which are connected in parallel and have opposite polarities. In other words, cathode of diode 142a is coupled with anode of diode 142b and first ground reference rail 112, and anode of diode 142a is coupled with cathode of diode 142b and common ground reference rail 116. ESD conduction circuit 142 is configured to isolate or to attenuate transmission of noise between first ground reference rail 112 and common ground reference rail 116 when the diodes 142a and 142b are both not turned on. ESD conduction circuit 144 is coupled between second ground reference rail 114 and common ground reference rail 116. ESD conduction circuit 144 includes two diodes 144a and 144b, which are also connected in parallel and have opposite polarities. ESD conduction circuit 144 is configured to isolate or to attenuate transmission of noise between second ground reference rail 114 and common ground reference rail 116 when the diodes 144a and 144b are not fully turned on.

There are two circuits 122 and 124 and corresponding power rails and ground reference rails and ESD protection circuits depicted in FIG. 1. In some embodiments, there are more or less than two circuits and corresponding power rails, ground reference rails, or ESD protection circuits implemented in integrated circuit 100.

Figure 2A:
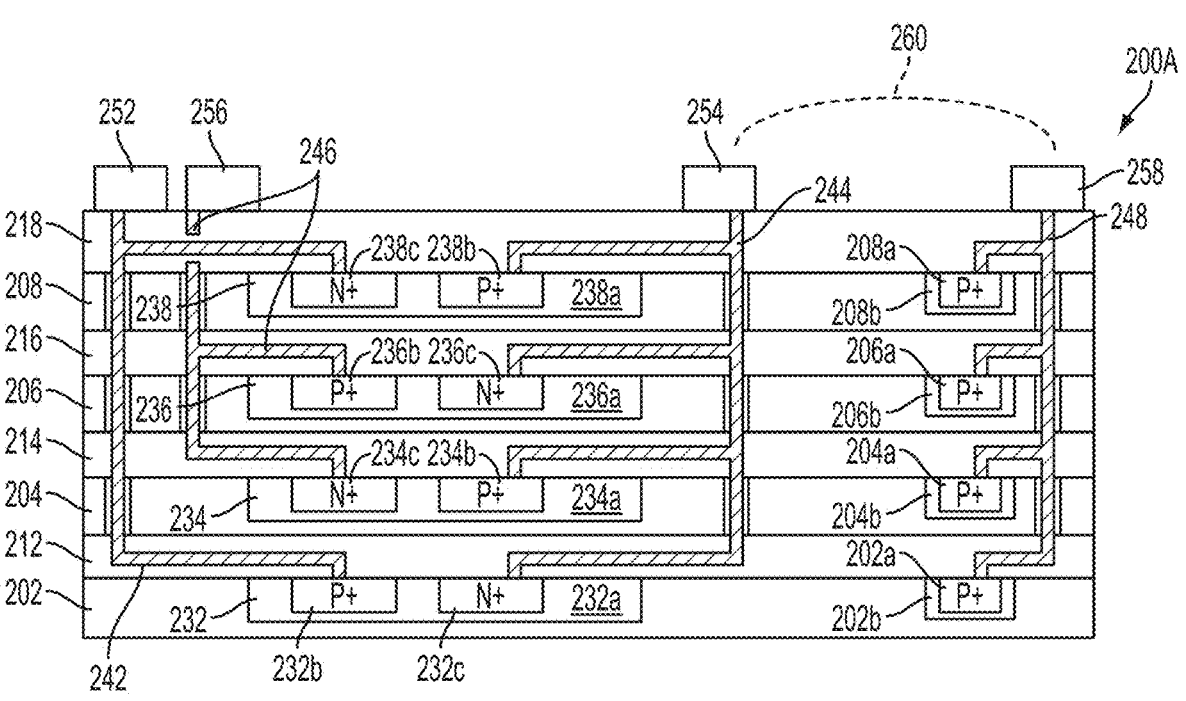
FIGS. 2A-2B are cross-sectional views of a portion of example integrated circuits in accordance with one or more embodiments.

FIG. 2A is a cross-sectional view of a portion of an example integrated circuit 200A in accordance with one or more embodiments. In some embodiments, integrated circuit 200A is manufactured based on a block diagram similar to the one depicted in FIG. 1. Integrated circuit 200A includes two or more substrates stacked one over another, including a first substrate 202, a second substrate 204 over first substrate 202, a third substrate 206 over second substrate 204, and a fourth substrate 208 over third substrate 206. The substrates 202-208 have a P-type doping, and are referred to as P-type substrates in this disclosure. Each of the substrates 202-208 has a corresponding heavily doped P-type region 202a, 204a, 206a, or 208a surrounded by a corresponding P-type well region 202b, 204b, 206b, or 208b. Each of the substrates 202-208 is capable of being biased through corresponding region 202a, 204a, 206a, or 208a and corresponding well region 202b, 204b, 206b, or 208b.

Each of the substrates 202-208 has a corresponding interconnection structure 212, 214, 216, and 218. In some embodiments, each of the interconnection structure 212, 214, 216, and 218 has one or more layers of conductive lines or conductive via plugs embedded in one or more layers of dielectric materials. In some embodiments, a set of electrical components are formed on one or more of the substrates 202-208. In some embodiments, the set of electrical components is connected by one or more of the interconnection structures 212-218 and is configured to form a first circuit, such as first circuit 122 in FIG. 1. The first circuit has a first internal ground node. In some embodiments, another set of electrical components are also formed on one or more of the substrates 202-208. In some embodiments, the another set of electrical components is connected by one or more of the interconnection structures 212-218 and is configured to form a second circuit, such as second circuit 124 in FIG. 1. The second circuit has a second internal ground node.

Each of the substrates 202-208 has a corresponding diode 232, 234, 236, or 238 formed thereon. Diode 232 includes a P-type well 232a, a P-type anode region 232b, and an N-type cathode region 232c. Diode 232 is also known as an N-type diode, because diode 232 has a structure that the cathode or N-type region is surrounded by the anode or P-type region of the diode. Diode 238 includes a P-type well 238a, a P-type anode region 238b, and an N-type cathode region 238c, and is also an N-type diode.

In some embodiments, diodes 232 and 238 have structures other than the example depicted in FIG. 2A.

Anode 232b of diode 232 is electrically connected to cathode 238c of diode 238 through a conductive structure 242, and cathode 232c of diode 232 is electrically connected to anode 238b of diode 238 through a conductive structure 244. Conductive structure 242 is usable as first ground reference rail 112 in FIG. 1 and is electrically connected to first ground node of first circuit 122. Conductive structure 244 is usable as a part of common ground reference rail 116 in FIG. 1. Thus, diode 232 and diode 238 are electrically connected in parallel and have opposite polarities between conductive structure 242 (as the first ground reference rail 112) and conductive structure 244 (as a part of the common ground reference rail 116). Thus, in FIG. 2A, ESD conduction circuit 142 is implemented by two diodes that are both N-type diodes.

Diode 234 includes an N-type well 234a, a P-type anode region 234b, and an N-type cathode region 234c. Diode 234 is also referred to as a P-type diode, because diode 234 has a structure that the anode or P-type region is surrounded by the cathode or N-type region of the diode. Diode 236 includes an N-type well 236a, a P-type anode region 236b, and an N-type cathode region 236c, and is also a P-type diode.

In some embodiments, diodes 234 and 236 have structures other than the example depicted in FIG. 2A.

Anode 234b of diode 234 is electrically connected to cathode 236c of diode 236 through conductive structure 244, and cathode 234c of diode 234 is electrically connected to anode 236b of diode 236 through a conductive structure 246. Conductive structure 246 is usable as second ground reference rail 114 in FIG. 1 and is electrically connected to second ground node of second circuit 124. Thus, diode 234 and diode 236 are electrically connected between conductive structure 246 (as the second ground reference rail 114) and conductive structure 244 (as a part of the common ground reference rail 116). Also, diode 234 and diode 236 are connected in parallel and have opposite polarities. Thus, in FIG. 2A, ESD conduction circuit 144 is implemented by two diodes that are both P-type diodes.

Integrated circuit 200A further includes a conductive structure 248 electrically connected to substrates 202-208 through corresponding heavily doped regions 202a, 204a, 206a, and 208a and corresponding well regions 202b, 204b, 206b, and 208b. Moreover, integrated circuit 200A includes pad structures 252, 254, 256, and 258 electrically connected to corresponding conductive structures 242, 244, 246, and 248. In some embodiments, conductive structures 244 and 248 are electrically connected (depicted by the dotted line 260), and conductive structure 248 thus is usable as another part of common ground reference rail 116 in FIG. 1. In some embodiments, the electrical connection 260 is implemented through an electrical path inside the integrated circuit 200A, such as through one or more of interconnection structures 212-218. In some embodiments, the electrical connection 260 is implemented through an electrical path outside the integrated circuit 200A, such as through an external conductive line connecting pad structures 254 and 258.

In some embodiments, each of conductive structures 242, 244, 246, and 248 includes a TSV, an ILV, a metal line, a via, a redistribution layer (RDL), a well structure, a polysilicon structure, or a combination thereof.

Figure 2B:
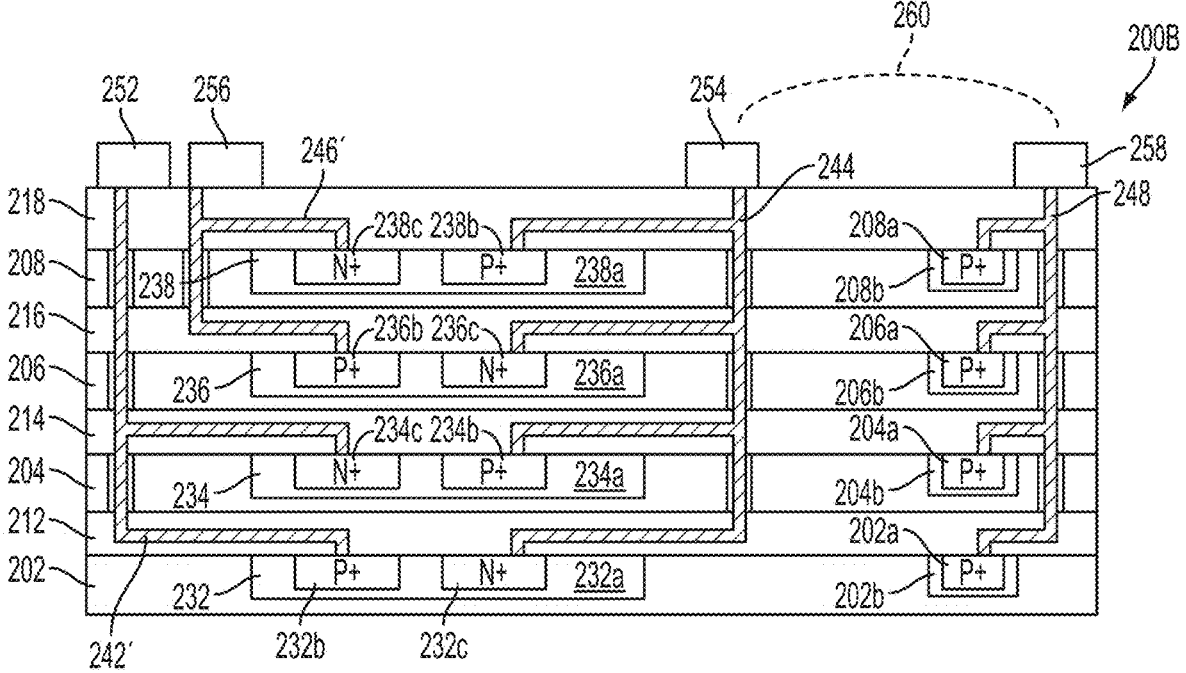

FIG. 2B is a cross-sectional view of a portion of another example integrated circuit 200B in accordance with one or more embodiments. Elements and features in FIG. 2B that are the same or similar to those in FIG. 2A are given the same reference numbers, and detailed description thereof is omitted.

Compared with integrated circuit 200A, integrated circuit 200B includes conductive structure 242' replacing conductive structure 242 and conductive structure 246' replacing conductive structure 246. In FIG. 2B, diode 232 and diode 234 are electrically connected between conductive structure 242' (as the first ground reference rail 112) and conductive structure 244 (as a part of the common ground reference rail 116). Diode 232 and diode 234 are connected in parallel and have opposite polarities. Also, diode 236 and diode 238 are electrically connected between conductive structure 246' (as the second ground reference rail 114) and conductive structure 244 (as a part of the common ground reference rail 116). Diode 236 and diode 238 are connected in parallel and have opposite polarities. Thus, in FIG. 2B, ESD conduction circuits 142 and 144 are each implemented by one P-type diode and one N-type diode.

Integrated circuit 200A and integrated circuit 200B are illustrated as non-limiting examples. Integrated circuit 200A and integrated circuit 200B are depicted as ILV-based 3D ICs. In some embodiments, integrated circuit 200A or integrated circuit 200B is a TSV-based 3D IC. In some embodiments, there are more or less than four substrates (and corresponding interconnections structures) in an integrated circuit. In some embodiments, the doping types of the substrates, the vertical order of various substrates, and the types and configurations of diodes are not limited to the examples depicted in FIG. 2A and FIG. 2B. Also, details of the interconnection structures 212-218 and the set of electrical components are simplified or omitted. Other suitable interconnection structures 212-218 and electrical components are within the scope of the present disclosure.

Figure 3A:
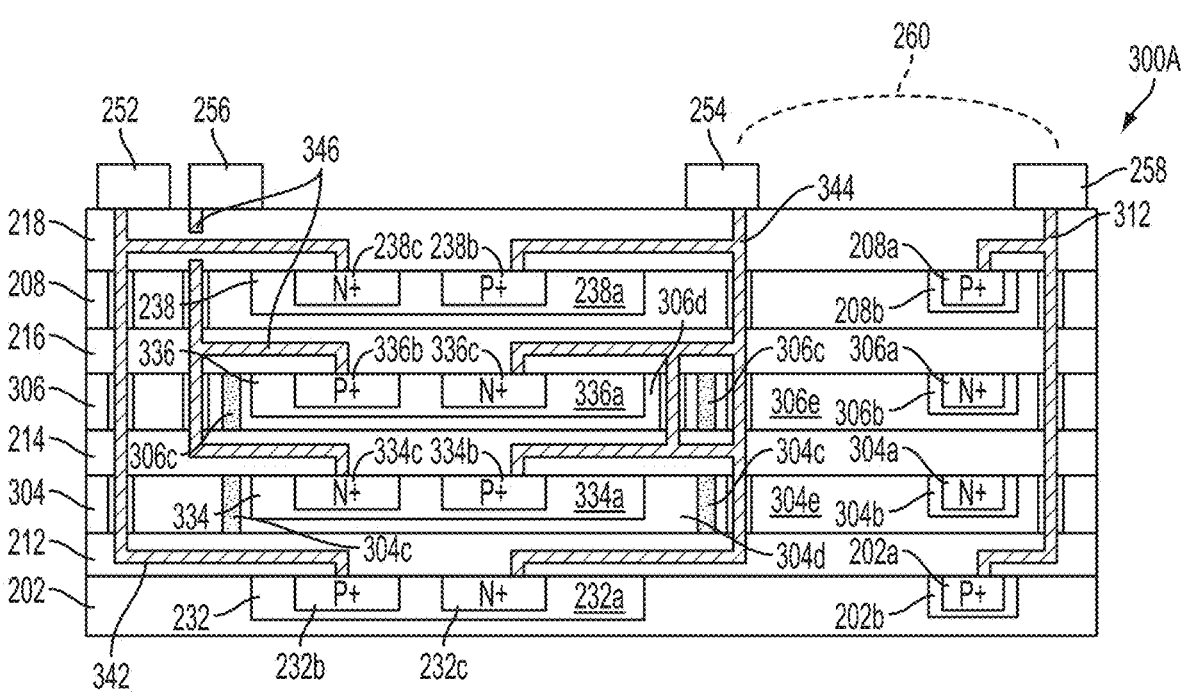
FIGS. 3A-3B are cross-sectional views of a portion of example integrated circuits in accordance with one or more embodiments.

FIG. 3A is a cross-sectional view of a portion of another example integrated circuit 300A in accordance with one or more embodiments. Elements and features in FIG. 3A that are the same or similar to those in FIG. 2A are given the same reference numbers, and detailed description thereof is omitted.

Compared with integrated circuit 200A, integrated circuit 300A has substrate 204 and substrate 206 replaced by substrate 304 and substrate 306. Substrates 304 and 306 have an N-type doping, and are referred to as N-type substrates in this disclosure. Each of the substrates 304 and 306 has a corresponding heavily doped N-type region 304a or 306a surrounded by a corresponding N-type well region 304b or 306b. Each of the substrates 304 and 306 is capable of being biased through corresponding region 304a or 306a and corresponding well region 304b or 306b.

Substrate 304 further includes an isolation structure 304c electrically separating substrate 304 into a first portion 304d surrounding by isolation structure 304c and a second portion 304e outside the isolation structure 304c. Substrate 306 further includes an isolation structure 306c electrically separating substrate 306 into a first portion 306d surrounding by isolation structure 306c and a second portion 306e outside the isolation structure 306c. In some embodiments, isolation structures 304c and 306c has a material including silicon oxide, or silicon nitride, or other suitable dielectric material.

Integrated circuit 300A further includes a conductive structure 312 that is electrically connected to pad structure 258 and functions as a part of common ground reference rail 116 in FIG. 1. Conductive structure 312 is electrically connected to substrates 202 and 204 through corresponding regions 202a or 208a and well regions 202b or 208a. In some embodiments, P-type transistors are formed on N-type substrates 204 or 206. In some embodiments, conductive structure 312, functioning as a part of the common ground reference rail of integrated circuit 300A, is electrically connected to a reference power source or ground, and source terminals of P-type transistors are electrically connected to a supply power source that has a voltage level greater than that of the reference power source or ground. Electrically connecting conductive structure 312 with N-type substrates 304 and 306 would cause the formation of leakage paths from power supply through P-type transistors to reference supply or ground, and thus is not preferable. Therefore, conductive structure 312 is free from being electrically connected to substrate 304 and substrate 306 through heavily doped regions 304a and 306a and corresponding well regions 304b and 306b.

Each of the substrates 304 and 306 has a corresponding diode 334 or 336 formed thereon. Diode 334 is formed on the portion 304d of substrate 304 and surrounded by isolation structure 304c. Diode 334 includes an N-type well 334a, a P-type anode region 334b, and an N-type cathode region 334c. Diode 334 is also referred to as a P-type diode, because diode 334 has a structure that the anode or P-type region is surrounded by the cathode or N-type region of the diode. Diode 336 is formed on the portion 306d of substrate 306 and surrounded by isolation structure 306c. Diode 336 includes an N-type well 336a, a P-type anode region 336b, and an N-type cathode region 336c, and is also a P-type diode.

In some embodiments, at least one of diodes 334 or 336 is a shallow trench isolation (STI) diode, a gated diode, a well diode, or a metal-oxide semiconductor (MOS) diode.

Anode 232b of diode 232 is electrically connected to cathode 238c of diode 238 through a conductive structure 342, which is in turn electrically connected to pad structure 252, and cathode 232c of diode 232 is electrically connected to anode 238b of diode 238 through a conductive structure 344, which is in turn electrically connected to pad structure 254. Conductive structure 342 is usable as first ground reference rail 112 in FIG. 1 and is electrically connected to first ground referenced node of first circuit 122. Conductive structure 344 is usable as a part of common ground reference rail 116 in FIG. 1. Thus, diode 232 and diode 238 are electrically connected between conductive structure 342 (as the first ground reference rail 112) and conductive structure 344 (as a part of the common ground reference rail 116). Also, diode 232 and diode 238 are connected in parallel and have opposite polarities. Thus, in FIG. 3A, ESD conduction circuit 142 is implemented by two diodes that are both P-type diodes.

Anode 334b of diode 334 is electrically connected to cathode 336c of diode 336 through conductive structure 344, and cathode 334c of diode 334 is electrically connected to anode 336b of diode 336 through a conductive structure 346, which is in turn electrically connected to pad structure 256. Conductive structure 346 is usable as second ground reference rail 114 in FIG. 1 and is electrically connected to second ground referenced node of first circuit 124. Thus, diode 334 and diode 336 are electrically connected between conductive structure 346 (as the second ground reference rail 114) and conductive structure 344 (as a part of the common ground reference rail 116). Also, diode 334 and diode 336 are connected in parallel and have opposite polarities. Thus, in FIG. 3A, ESD conduction circuit 144 is implemented by two diodes that are both P-type diodes.

Figure 3B:
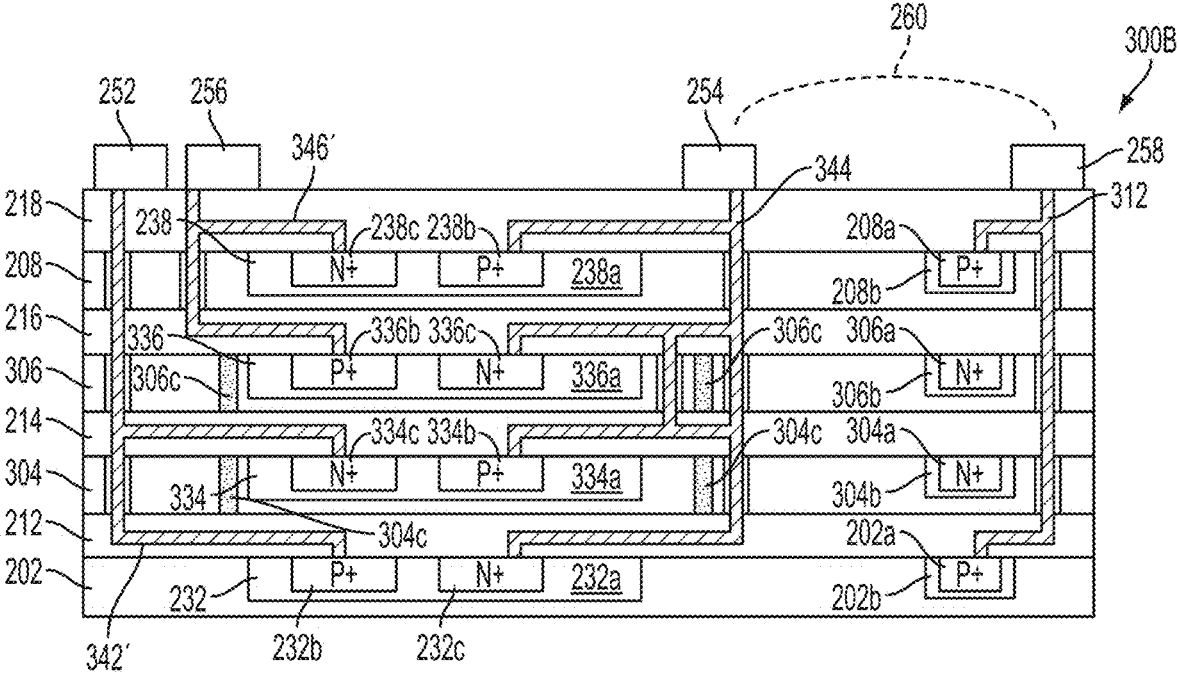

FIG. 3B is a cross-sectional view of a portion of another example integrated circuit 300B in accordance with one or more embodiments. Elements and features in FIG. 3B that are the same or similar to those in FIG. 2A and FIG. 3A are given the same reference numbers, and detailed description thereof is omitted.

Compared with integrated circuit 300A, integrated circuit 300B has conductive structure 342' replacing conductive structure 342 and conductive structure 346' replacing conductive structure 346. In FIG. 3B, diode 232 and diode 334 are electrically connected between conductive structure 342' (as the first ground reference rail 112) and conductive structure 344 (as a part of the common ground reference rail 116). Diode 232 and diode 334 are connected in parallel and have opposite polarities. Also, diode 336 and diode 238 are electrically connected between conductive structure 346' (as the second ground reference rail 114) and conductive structure 244 (as a part of the common ground reference rail 116). Diode 336 and diode 238 are connected in parallel and have opposite polarities. Thus, in FIG. 3B, ESD conduction circuits 142 and 144 are each implemented by one P-type diode and one N-type diode.

Integrated circuit 300A and integrated circuit 300B are illustrated as non-limiting examples. Integrated circuit 300A and integrated circuit 300B are depicted as ILV-based 3D ICs. In some embodiments, integrated circuit 300A or integrated circuit 300B is a TSV-based 3D IC. In some embodiments, there are more or less than four substrates (and corresponding interconnections structures) in an integrated circuit. In some embodiments, the doping types of the substrates, the vertical order of various substrates, and the types and configurations of diodes are not limited to the examples depicted in FIG. 3A and FIG. 3B.

FIG. 4 is a flow chart of a method 400 of manufacturing an integrated circuit, such as integrated circuit 200A, 200B, 300A, or 300B, in accordance with one or more embodiments. It is understood that additional operations may be performed before, during, and/or after the method 400 depicted in FIG. 4, and that some other processes may only be briefly described herein.

As depicted in FIG. 4 and FIG. 2A, method 400 begins with operation 410, where a first diode (such as diode 232) is formed on a substrate (such as substrate 232) of one or more stacked substrates. In operation 420, a second diode (such as diode 238) is formed on another substrate (such as substrate 238) of the one or more stacked substrates. In some embodiments, operations 410 and 420 are performed according to a suitable N-type MOS (NMOS) process, P-type MOS (PMOS) process, complementary MOS (CMOS) process, bipolar junction transistor (BJT) process, or other suitable process.

As depicted in FIG. 3A, if the first and second diodes are formed in N-type substrates (such as substrates 304 and 306), operation 410 further includes forming a first isolation structure (such as isolation structure 304c) surrounding the first diode (such as diode 334) in substrate 304. Also, operation 430 further includes forming a second isolation structure (such as isolation structure 306c) surrounding the second diode (such as diode 336) in substrate 306.

In operation 430, a conductive path (such as conductive structure 242) is formed to electrically connect an anode of the first diode and a cathode of the second diode. Also, in operation 430, another conductive path (such as conductive structure 244) is formed to electrically connect a cathode of the first diode and an anode of the second diode. In some embodiments, conductive structure 242 is electrically connected with an internal ground node of a first circuit 122, and conductive structure 244 functions as a local ground reference rail (such as ground reference rail 112).

In operation 440, a common ground rail (such as conductive structure 248) is formed to be electrically connected with one or more P-type substrates (such as substrate 202, 204, 206, and/or 208). As depicted in FIG. 4 and FIG. 3A, in some embodiments, the common ground rail is free from being electrically connected to N-type substrates (such as substrate 304 and 306).

In operation 450, the common ground rail and the local ground rail are electrically connected, either within the integrated circuit using the interconnection structures 212-218 or outside the integrated circuit through pad structures 254 and 258.

In an embodiment, an integrated circuit includes: includes two or more substrates stacked one over another, the two or more substrates including: a first substrate having an N-type doping; a second substrate having the N-type doping; a third substrate having a P-type doping; and a fourth substrate having the P-type doping; the first substrate including a first dielectric isolation structure electrically separating the second substrate into a first portion surrounded by the first dielectric isolation structure and a second portion outside the first dielectric isolation structure, a first set of electrical components on one or more substrate of the two or more substrates, the first set of electrical components being configured to form a first circuit; a first ground reference rail electrically connected to the first circuit; a first common ground reference rail, the first circuit being connected between a first power supply rail and the first ground reference rail; and a first electrostatic discharge (ESD) conduction element electrically connected between the first ground reference rail and the first common ground reference rail, the first ESD conduction element including a first diode in the first portion of the first substrate, the first diode including a first well having the N-type doping, and a second diode in the third substrate, the second diode including a second well having the P-type doping; the first diode and the second diode being electrically connected in parallel and having opposite polarities; and a second common ground reference rail electrically connected to the third substrate and the fourth substrate.

In an embodiment, the first common ground reference rail is electrically connected to the second common ground reference rail through an electrical path inside the integrated circuit. In an embodiment, the first common ground reference rail is electrically connected to the second common ground reference rail through an electrical path outside the integrated circuit. In an embodiment, at least one of the first diode or the second diode is a shallow trench isolation (STI) diode, a gated diode, a well diode, or a metal-oxide semiconductor (MOS) diode. In an embodiment, the first diode is a P-type diode; and the second diode is an N-type diode. In an embodiment, the first substrate is stacked on the third substrate; the second substrate is stacked on the first substrate; and the fourth substrate is stacked on the second substrate. In an embodiment, the first dielectric isolation structure includes silicon dioxide or silicon nitride. In an embodiment, the first diode includes an anode and a cathode; and the second diode includes an anode and a cathode; and the cathode of the first diode being electrically connected to the anode of the second diode, and the anode of the first diode being electrically connected to the cathode of the second diode.

In an embodiment, an integrated circuit includes: two or more substrates stacked one over another, the two or more substrates including: a first substrate having a P-type doping; a second substrate having the P-type doping; a third substrate having an N-type doping; and a fourth substrate having the N-type doping; the first substrate including a first dielectric isolation structure electrically separating the first substrate into a first portion surrounded by the first dielectric isolation structure and a second portion outside the first dielectric isolation structure; the second substrate including a second dielectric isolation structure electrically separating the second substrate into a first portion surrounded by the second dielectric isolation structure and a second portion outside the second dielectric isolation structure; a set of electrical components on one or more of the two or more substrates, the set of electrical components being configured to form a circuit, the circuit comprising an internal ground node; a ground reference rail electrically connected to the first substrate and the second substrate and free from being electrically connected to the third substrate and the fourth substrate; and an electrostatic discharge (ESD) protection circuit electrically coupled between the internal ground node and the ground reference rail.

In an embodiment, the ESD protection circuit includes: a first diode on one of the first substrate, the second substrate, the third substrate, or the fourth substrate, the first diode including an anode and a cathode; and a second diode on another one of the first substrate, the second substrate, the third substrate, or the fourth substrate, the second diode including an anode and a cathode; and wherein the cathode of the first diode is electrically connected to the anode of the second diode, and the anode of the first diode is electrically connected to the cathode of the second diode. In an embodiment, the first diode is on the first substrate; and the second diode is on the third substrate. In an embodiment, the cathode of the first diode is electrically connected to the anode of the second diode, and the anode of the first diode is electrically connected to the cathode of the second diode. In an embodiment, the integrated circuit further includes: a third diode on the fourth substrate; and a fourth diode on the second substrate. In an embodiment, the third substrate is stacked on the first substrate; the fourth substrate is stacked on the third substrate; and the second substrate is stacked on the fourth substrate.

In an embodiment, an integrated circuit includes: a stack including a first substrate, a second substrate, a third substrate and a fourth substrate; the first substrate and the fourth substrate each having a P-type doping; the second substrate and the third substrate each having an N-type doping; a first common ground reference rail electrically connected to first regions located correspondingly on the first through fourth substrates; the first regions on the first and third substrates having the N-type doping; and the first regions on the second and fourth substrates having the P-type doping; a second common ground reference rail electrically connected to second regions on the first and second substrates; the second regions on the first and second substrates having the P-type doping; the second common ground reference rail being free from being electrically connected to the third and fourth substrates; and a first electrostatic discharge (ESD) conduction element between a first ground reference rail of a first circuit and the first common ground reference rail, the first ESD conduction element including: a first diode between the first region on the first substrate and the first ground reference rail; and a second diode between the first region on the second substrate and the first ground reference rail.

In an embodiment, the integrated circuit further includes a second ESD conduction element between a second ground reference rail of a second circuit and the first common ground reference rail, the second ESD conduction element including: a third diode between the first region on the third substrate and the second ground reference rail; and a fourth diode between the first region on the fourth substrate and the second ground reference rail. In an embodiment, the first common ground reference rail is electrically connected to the second common ground reference rail through an electrical path inside the integrated circuit. In an embodiment, the second substrate is stacked on the first substrate; the third substrate is stacked on the second substrate; and the fourth substrate is stacked on the third substrate. In an embodiment, a cathode of the first diode is electrically connected to an anode of the second diode; and an anode of the first diode is electrically connected to a cathode of the second diode. In an embodiment, the integrated circuit further includes: a third diode on the fourth substrate; a fourth diode on the second substrate; and wherein a cathode of the third diode is electrically connected to an anode of the fourth diode; and an anode of the third diode is electrically connected to a cathode of the fourth diode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:

two or more substrates stacked one over another, the two or more substrates including:

a first substrate having an N-type doping;

a second substrate having the N-type doping;

a third substrate having a P-type doping; and a fourth substrate having the P-type doping;

the first substrate including:

a first dielectric isolation structure electrically separating the first substrate into a first portion surrounded by the first dielectric isolation structure and a second portion outside the first dielectric isolation structure;

a first set of electrical components on one or more substrate of the two or more substrates, the first set of electrical components being configured to form a first circuit;

a first ground reference rail electrically connected to the first circuit;

a first part of a common ground reference rail, the first circuit being connected between a first power supply rail and the first ground reference rail; and a first electrostatic discharge (ESD) conduction element electrically connected between the first ground reference rail and the first part of the common ground reference rail, the first ESD conduction element including:

a first diode in the first portion of the first substrate, the first diode including a first well having the N-type doping; and a second diode in the third substrate, the second diode including a second well having the P-type doping;

the first diode and the second diode being electrically connected in parallel and having opposite polarities; and a second part of the common ground reference rail electrically connected to the third substrate and the fourth substrate.

2. The integrated circuit of claim 1, wherein:

the first part of the common ground reference rail is electrically connected to the second part of the common ground reference rail through an electrical path inside the integrated circuit.

3. The integrated circuit of claim 1, wherein:

the first part of the common ground reference rail is electrically connected to the second part of the common ground reference rail through an electrical path outside the integrated circuit.

4. The integrated circuit of claim 1, wherein:

at least one of the first diode or the second diode is a shallow trench isolation (STI) diode, a gated diode, a well diode, or a metal-oxide semiconductor (MOS) diode.

5. The integrated circuit of claim 1, wherein:

the first diode is a P-type diode; and the second diode is an N-type diode.

6. The integrated circuit of claim 1, wherein:

the first substrate is stacked on the third substrate;

the second substrate is stacked on the first substrate; and the fourth substrate is stacked on the second substrate.

7. The integrated circuit of claim 1, wherein:

the first dielectric isolation structure includes silicon dioxide or silicon nitride.

8. The integrated circuit of claim 1, wherein:

the first diode includes an anode and a cathode; and the second diode includes an anode and a cathode; and the cathode of the first diode being electrically connected to the anode of the second diode, and the anode of the first diode being electrically connected to the cathode of the second diode.

9. An integrated circuit comprising:

a stack including a first substrate, a second substrate, a third substrate and a fourth substrate;

the first substrate and the fourth substrate each having a P-type doping;

the second substrate and the third substrate each having an N-type doping;

a first part of a common ground reference rail electrically connected to first regions located correspondingly in the first through fourth substrates;

the first regions on the first and third substrates having the N-type doping; and the first regions on the second and fourth substrates having the P-type doping;

a second part of the common ground reference rail electrically connected to second regions on the first and fourth substrates;

the second regions on the first and fourth substrates having the P-type doping;

the second part of the common ground reference rail being free from being electrically connected to the second and third substrates; and a first electrostatic discharge (ESD) conduction element between a first ground reference rail of a first circuit and the first part of the common ground reference rail, the first ESD conduction element including:

a first diode between the first region on the first substrate and the first ground reference rail; and a second diode between the first region on the second substrate and the first ground reference rail.

10. The integrated circuit of claim 9, further comprising:

a second ESD conduction element between a second ground reference rail of a second circuit and the first part of the common ground reference rail, the second ESD conduction element including:

a third diode between the first region on the third substrate and the second ground reference rail; and a fourth diode between the first region on the fourth substrate and the second ground reference rail.

11. The integrated circuit of claim 9, wherein:

the first part of the common ground reference rail is electrically connected to the second part of the common ground reference rail through an electrical path inside the integrated circuit.

12. The integrated circuit of claim 9, wherein:

the second substrate is stacked on the first substrate;

the third substrate is stacked on the second substrate; and the fourth substrate is stacked on the third substrate.

13. The integrated circuit of claim 9, wherein:

a cathode of the first diode is electrically connected to an anode of the second diode; and an anode of the first diode is electrically connected to a cathode of the second diode.

14. The integrated circuit of claim 9, further comprising:

a third diode on the fourth substrate;

a fourth diode on the second substrate; and wherein:

a cathode of the third diode is electrically connected to an anode of the fourth diode; and an anode of the third diode is electrically connected to a cathode of the fourth diode.

15. An integrated circuit comprising:

two or more substrates stacked one over another, the two or more substrates including:

a first substrate having an N-type doping;

a second substrate having the N-type doping;

a third substrate having a P-type doping; and a fourth substrate having the P-type doping;

the first substrate including:

a first dielectric isolation structure electrically separating the first substrate into a first portion surrounded by the first dielectric isolation structure and a second portion outside the first dielectric isolation structure;

a first set of electrical components on one or more substrate of the two or more substrates, the first set of electrical components being configured to form a first circuit;

a first ground reference rail electrically connected to the first circuit;

a first part of a common ground reference rail, the first circuit being connected between a first power supply rail and the first ground reference rail; and a first electrostatic discharge (ESD) conduction element electrically connected between the first ground reference rail and the first part of the common ground reference rail, the first ESD conduction element including:

a first diode in the first portion of the first substrate, the first diode including a first well having the N-type doping; and a second diode in the third substrate, the second diode including a second well having the P-type doping, a cathode of the second diode being electrically connected to an anode of the first diode, and an anode of the second diode being electrically connected to a cathode of the first diode;

the first diode and the second diode being electrically connected in parallel and having opposite polarities; and a second part of the common ground reference rail electrically connected to the third substrate and the fourth substrate.

16. The integrated circuit of claim 15, wherein:

the first part of the common ground reference rail is electrically connected to the second part of the common ground reference rail through an electrical path inside the integrated circuit.

17. The integrated circuit of claim 15, wherein:

the first part of the common ground reference rail is electrically connected to the second part of the common ground reference rail through an electrical path outside the integrated circuit.

18. The integrated circuit of claim 15, wherein:

at least one of the first diode or the second diode is a shallow trench isolation (STI) diode, a gated diode, a well diode, or a metal-oxide semiconductor (MOS) diode.

19. The integrated circuit of claim 15, wherein:

the first diode is a P-type diode; and the second diode is an N-type diode.

20. The integrated circuit of claim 15, wherein:

the first substrate is stacked on the third substrate;

the second substrate is stacked on the first substrate; and the fourth substrate is stacked on the second substrate.

\*　\*　\*　\*　\*